United States Patent
Wolter et al.

(10) Patent No.: US 8,875,003 B1
(45) Date of Patent: Oct. 28, 2014

(54) INTERLEAVED DATA COMMUNICATIONS VIA POWER LINE

(75) Inventors: Chad Wolter, Breezy Point, MN (US); Damian Bonicatto, Pequot Lakes, MN (US)

(73) Assignee: Landis+Gyr Technologies, LLC, Pequot Lakes, MN (US)

(*) Notice: Subject to any disclaimer, the term of this patent is extended or adjusted under 35 U.S.C. 154(b) by 130 days.

(21) Appl. No.: 13/334,626

(22) Filed: Dec. 22, 2011

(51) Int. Cl.
*H03M 13/00* (2006.01)

(52) U.S. Cl.
USPC .......................................................... 714/784

(58) Field of Classification Search
None
See application file for complete search history.

(56) References Cited

U.S. PATENT DOCUMENTS

| | | | |
|---|---|---|---|
| 5,581,229 A | 12/1996 | Hunt | |
| 6,154,488 A | 11/2000 | Hunt | |
| 6,177,884 B1 | 1/2001 | Hunt et al. | |
| 6,397,368 B1* | 5/2002 | Yonge et al. | 714/792 |
| 6,775,799 B1* | 8/2004 | Giorgetta et al. | 714/751 |
| 6,998,963 B2 | 2/2006 | Flen et al. | |
| 7,102,490 B2 | 9/2006 | Flen et al. | |
| 7,145,438 B2 | 12/2006 | Flen et al. | |
| 7,180,412 B2 | 2/2007 | Bonicatto et al. | |
| 7,184,861 B2 | 2/2007 | Petite | |
| 7,209,840 B2 | 4/2007 | Petite et al. | |
| 7,224,740 B2 | 5/2007 | Hunt | |
| 7,236,765 B2 | 6/2007 | Bonicatto et al. | |
| 7,346,463 B2 | 3/2008 | Petite et al. | |
| 7,409,623 B2* | 8/2008 | Baker et al. | 714/763 |
| 7,432,824 B2 | 10/2008 | Flen et al. | |
| 7,443,313 B2 | 10/2008 | Davis et al. | |
| 7,468,661 B2 | 12/2008 | Petite et al. | |
| 7,706,320 B2 | 4/2010 | Davis et al. | |
| 7,738,999 B2 | 6/2010 | Petite | |
| 7,742,393 B2 | 6/2010 | Bonicatto et al. | |
| 7,774,530 B2 | 8/2010 | Haug et al. | |
| 7,791,468 B2 | 9/2010 | Bonicatto et al. | |
| 7,877,218 B2 | 1/2011 | Bonicatto et al. | |
| 7,978,059 B2 | 7/2011 | Petite et al. | |
| 8,144,816 B2 | 3/2012 | Bonicatto et al. | |
| 8,144,820 B2 | 3/2012 | Bonicatto | |
| 8,194,789 B2 | 6/2012 | Wolter et al. | |
| 8,238,263 B2 | 8/2012 | Kohout et al. | |
| 8,370,706 B2* | 2/2013 | Chin et al. | 714/758 |
| 2002/0188908 A1* | 12/2002 | Yonge et al. | 714/779 |
| 2005/0289615 A1* | 12/2005 | Nishitani | 725/88 |
| 2006/0107130 A1* | 5/2006 | Baker et al. | 714/710 |
| 2006/0145834 A1* | 7/2006 | Berkman et al. | 340/538.17 |
| 2007/0229305 A1* | 10/2007 | Bonicatto et al. | 340/870.03 |
| 2008/0304595 A1 | 12/2008 | Haug et al. | |
| 2011/0121952 A1 | 5/2011 | Bonicatto et al. | |

(Continued)

*Primary Examiner* — Albert Decady
*Assistant Examiner* — Enamul M Kabir
(74) *Attorney, Agent, or Firm* — Crawford Maunu PLLC

(57) ABSTRACT

Aspects of the present disclosure are directed towards communications over current-carrying power distribution lines. In accordance with one or more embodiments, respective sets of utility-based data indicative of a reading of utility usage taken at different times are communicated. First sets of the data corresponding to readings taken during a first time period are communicated and, thereafter, second sets of the data corresponding to readings taken during a second time period are communicated and interleaved with portions of error correction code (ECC) data. Prior to receiving at least some of the ECC data, the first sets of data are interpreted and access is provided to the interpreted data. After all of the ECC data has been received, the ECC data is used to verify the first sets of data, correct the first sets of data, and access to is provided to the verified first sets of data.

30 Claims, 2 Drawing Sheets

(56) References Cited

U.S. PATENT DOCUMENTS

| | | |
|---|---|---|
| 2011/0176598 A1 | 7/2011 | Kohout et al. |
| 2011/0218686 A1 | 9/2011 | McHann, Jr. et al. |
| 2011/0249678 A1 | 10/2011 | Bonicatto et al. |
| 2012/0057592 A1 | 3/2012 | Zeppetelle et al. |
| 2012/0076212 A1 | 3/2012 | Zeppetelle et al. |
| 2012/0084559 A1 | 4/2012 | Bonicatto |
| 2012/0106664 A1 | 5/2012 | Bonicatto et al. |

* cited by examiner

INTERLEAVED DATA COMMUNICATIONS VIA POWER LINE

BACKGROUND

Service providers utilize distributed networks to provide services to customers over large geographic areas. For example, communications companies utilize a distributed communications network to provide communications services to customers. Similarly, power companies utilize a network of power lines and meters to provide power to customers throughout a geographic region and receive data back about the power usage. Other utility-based service providers, such as those providing water or gas, also utilize distributed network systems for providing the respective utilities.

These service providers are dependent on proper operation of their respective networks to deliver services to the customers. Often, it can be desirable or necessary to ascertain information regarding the services that are provided. For example, the service provider may want access to daily usage reports to efficiently bill their customers for the resources that are consumed or otherwise utilized by the customers. Therefore, it is important for data specifying resource utilization and other information to be reliably transmitted and/or received at specified intervals.

In power line communication (PLC) networks, endpoints in the network (e.g., meters, load control switches, remote service switches, and other endpoints) can provide updated information (e.g., power consumption information and/or endpoint operating status information) by transmitting data over power lines that also carry alternating current. However, effectively communicating such data can be challenging to accomplish, particularly in a timely manner.

These and other matters have presented challenges to the communication of information over power lines.

SUMMARY

The present disclosure is directed to systems and methods for use with the communication of data over alternating current-carrying power lines. These and other aspects of the present disclosure are exemplified in a number of illustrated implementations and applications, some of which are shown in the figures and characterized in the claims section that follows.

Various embodiments are directed to the periodic communication of data, such as utility-based data, over current-carrying power lines, in which sets of communicated utility-based data are initially presented in a raw/unverified type of form, therein providing rapid access to the data. After error-checking type data for the sets of initially-presented data is received during the subsequent time period, the initially presented sets of utility-based data are verified using the error-checking type data, and the verified sets are presented for providing a verified (e.g., more accurate) representation of the utility-based data.

Other example embodiments are directed to communicating sets of utility-based data such as utility meter readings, status data and diagnostic data over power distribution lines carrying alternating current, in which each set of utility-based data is indicative of a reading of utility usage. Encoded first sets of the utility-based data are communicated over the power distribution lines (carrying alternating current), the first sets respectively corresponding to readings of the utility usage taken at different times during a first time period. During a second time period, encoded second sets of the utility-based data are respectively communicated over the power distribution lines carrying alternating current, the second sets corresponding to readings of the utility usage taken at different times during a second time period and interleaved with portions of error correction code (ECC) data for the first sets of the utility-based data. Prior to receiving the portions of ECC data, the first sets of utility-based data are interpreted and access is provided thereto. Subsequent to receiving the ECC data, the ECC data is used to verify the first sets of utility-based data, and access to the verified first sets of utility-based data is provided.

Other example embodiments are directed to communicating utility-usage data over power distribution lines as follows. A first set of utility-usage data is received, stored, and encoded according to a transmission protocol. The data may be stored prior to and/or after encoding. The encoded first set of utility-usage data is transmitted over at least one of the power distribution lines. After transmitting the first set of utility-usage data, a second set of utility-usage data is received, stored and encoded according to the transmission protocol (storage being before and/or after encoding). The encoded second set of utility-usage data is transmitted over one or more of the power distribution lines. Error correction code (ECC) data is generated based upon both the first and second sets of utility-usage data, and the error correction code is stored. A third set of utility-usage data is received, and respective portions of the stored error correction code are interleaved with portions of the third set of time-sensitive utility-usage data to generate interleaved data. The interleaved data is encoded according to the transmission protocol and transmitted over at least one of the power distribution lines.

Various other example embodiments are directed to an apparatus including a processing circuit and a communication circuit that communicates signals carried on power distribution lines carrying alternating current. The processing circuit communicates, via the communication circuit and over the power distribution lines carrying alternating current, encoded first sets of utility-based data respectively corresponding to readings of utility usage taken at different times during a first time period. The processing circuit further communicates (via the communication circuit and over the power distribution lines carrying alternating current) encoded second sets of utility-based data respectively corresponding to readings of utility usage taken at different times during a second time period, the second sets of utility-based data being interleaved with portions of error correction code (ECC) data for the first sets of utility-based data. Prior to receiving the portions of ECC data, the processing circuit interprets and provides access to the first sets of utility-based data (e.g., presents unverified data for rapid access). Subsequent to receiving the ECC data, the processing circuit uses the ECC data to verify the first sets of utility-based data and provides access to the verified first sets of utility-based data (e.g., presents verified data).

The above summary is not intended to describe each illustrated embodiment or every implementation of the present disclosure. The figures and detailed description that follow, including that described in the appended claims, more particularly describe some of these embodiments.

BRIEF DESCRIPTION OF FIGURES

Various example embodiments may be more completely understood in consideration of the following detailed description in connection with the accompanying drawings, in which.

Figure 1:
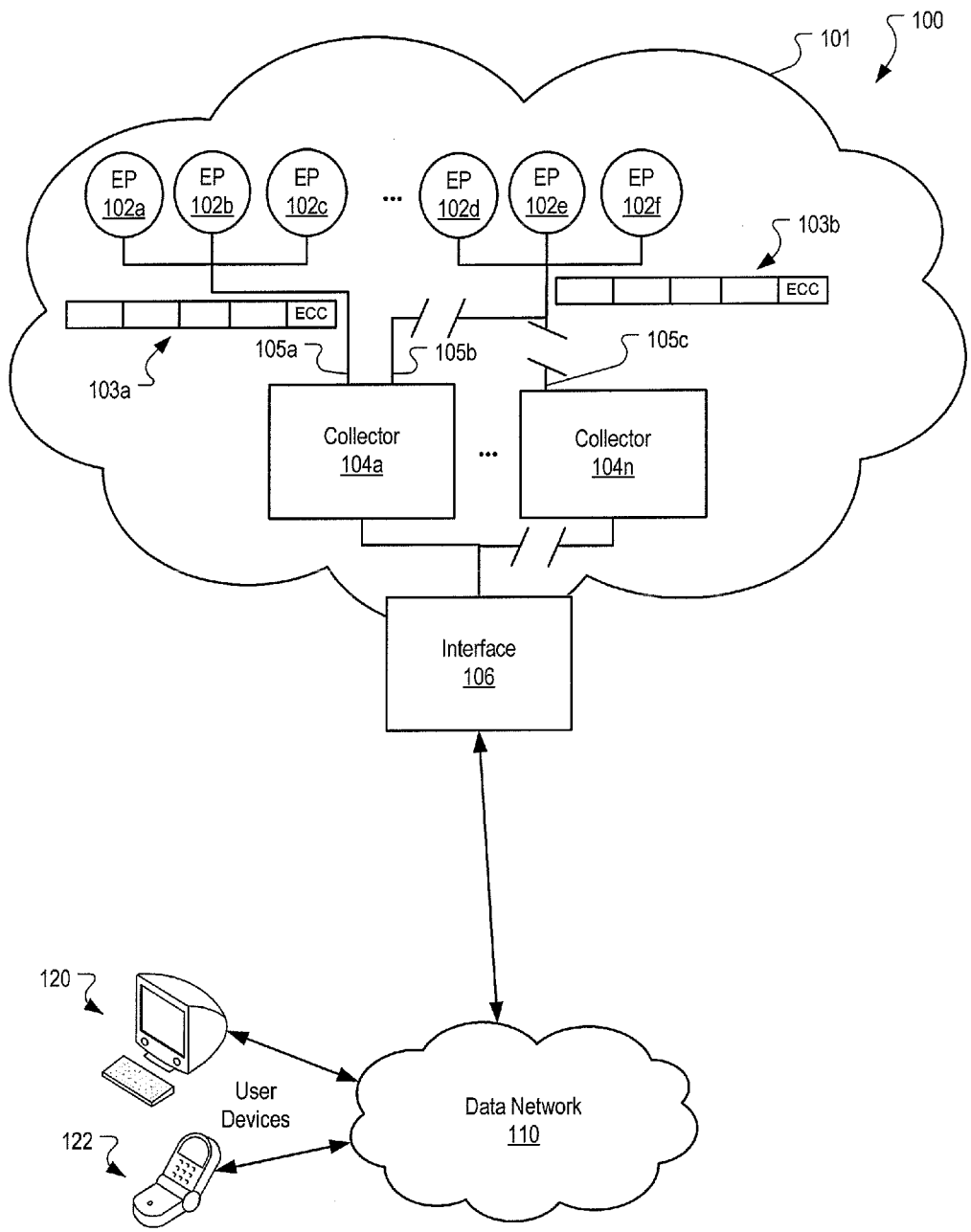
FIG. 1 is a block diagram of an example network environment in which endpoints transmit data, consistent with one or more example embodiments of the present disclosure.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

DETAILED DESCRIPTION

Aspects of the present disclosure are believed to be applicable to a variety of different types of devices, systems and arrangements, including those that may be implemented for communicating data over current-carrying power lines. While the present disclosure is not necessarily limited to such applications, various aspects of the invention may be appreciated through a discussion of various examples using this context.

Various embodiments are directed to the periodic communication of utility-based data over current-carrying power lines, in which sets of utility-based data are communicated over the power lines during respective time periods. Error-checking type data is generated for a particular set of utility-based data that is communicated during a first time period. This error checking data is interleaved with subsequent utility-based data, and the interleaved data is communicated during a subsequent time period.

Accordingly, the respective sets of utility-based data can be initially communicated and presented in a raw/unverified type of form, therein providing rapid access to the data (albeit in an unverified/uncorrected utility-based data as it is received). After the error-checking type data is received during a subsequent time period, the initially-presented sets of utility-based data can be verified using the error-checking type data, and the verified sets are presented for providing a verified (e.g., more accurate) representation of the utility-based data. In addition, this approach permits for the calculation of error-checking type data for several (stored) sets of utility-based data over several communication cycles, with the later communication of error-checking type data over a subsequent cycle, to provide delayed data verification while also ensuring rapid access to the raw data, and accommodating bandwidth requirements for communications links.

In one particular example, utility meter data is read and communicated at 15-minute intervals, and also stored for generating error correction code (ECC) data for an hour's worth of communications (four sets of data sent at 15-minute intervals). The data is provided in raw form as it is communicated, and an ECC is generated using all four of the sets of data communicated during the first hour. The ECC is split into four portions and, during a subsequent one-hour cycle in which additional sets of utility meter data are read and communicated every 15 minutes in raw form, the ECC data is interleaved with each additional set of raw utility meter data. At the end of this second hour, the interleaved portions of ECC data are combined and used to regenerate the ECC, which in turn is used to verify/correct the raw utility-based data received during the first hour. In this context, the communication of the ECC data can be effected in an interleaved manner that reduces an effect on bandwidth relative, for example, to communicating an entire ECC at once. Moreover, the delay in receiving the ECC for verification of the utility-based data sent during the first hour can be accommodated by providing rapid access to the raw data.

In certain implementations, first and second sets of the utility-based data respectively correspond to readings of the utility usage taken at different times during first and second time periods. The first and second sets are encoded and communicated respectively during first and second time periods (e.g., the first set is communicated during the first time period in which the corresponding readings are taken, and the second set is communicated during the second time period in which the corresponding readings are taken). Prior to communication, the second sets of data are interleaved with portions of error correction code (ECC) data for the first sets of data.

Prior to receiving the portions of ECC data, the first sets of utility-based data are interpreted and access is provided thereto. In this context, rapid (albeit unverified) access is provided to the data as it is received. Once the respective portions of the ECC data has been received, the ECC data is used to verify the first sets of utility-based data, and access to the verified first sets of utility-based data is provided.

The ECC data may, for example, be generated based upon all of the first sets of data and partitioned such that respective (smaller) portions of the ECC data can be interleaved with different ones of the second sets of data. Portions of the ECC data received with ones of the second sets of utility-based data are then combined and used to verify the all of the first sets of utility-based data. In this context, a single set of ECC data can be generated for multiple sets of utility-based data (e.g., multiple meter readings), communicated efficiently and then combined and used to verify each set of utility-based data for which the ECC data is generated.

These approaches can be useful, for example, for efficient generation of ECC data for multiple sets of utility-based data (e.g., rather than generating ECC data for each set), then subsequently communicating the ECC data in portions (e.g., rather than communicating an entire ECC at once). Further, where such utility-based data is communicated from many tens, hundreds, thousands or millions of endpoint-type devices (e.g., utility devices at individual businesses or households), partitioning and interleaving the ECC data with respective (small) sets of utility-based readings can facilitate such communications over common power distribution lines with relatively limited bandwidth consumption.

The utility-based data and ECC data can be encoded for communication in one or more of a variety of manners. In some embodiments, the utility-based data is encoded using a Reed-Solomon block coding. In such embodiments, the ECC data may be parity data that is generated using the entire encoded first sets of the utility-based data, and accordingly interleaved for communication with second sets of such data as discussed above. In particular example embodiments, each one of second sets of utility-based data is interleaved with an encoded portion of the ECC data, the portions of the ECC data interleaved with the second sets of utility-based data including all of the ECC data for the first sets of utility-based data. Further, the respective sets of data can be modulated to correspond to the communication of the data over the power lines (e.g., with respective frequency characteristics relating to alternating current that is concurrently passed over the same power lines).

Once communicated, the respective sets of utility-based data may be presented by interpreting and providing access to the data. For example, the communicated data can be demodulated, and access can be provided to the demodulated data before the data is validated. Later, upon demodulation of related ECC data interleaved with further sets of the utility-based data, the demodulated ECC data is used to validate the demodulated data to which it corresponds (generating validated data), with the validated data then being presented for subsequent (and potentially more accurate) access.

In some embodiments, the ECC data is used to verify corresponding sets of utility-based data by correcting transmission-based errors in one or more of the sets of utility-based data. Access is thus provided to verified sets of utility-based data by using the ECC data to correct errors and presenting the corrected data for access.

A variety of different approaches for communicating with different types of devices (e.g., endpoint) devices can be implemented for communicating different types of utility-based data. For example, a plurality of endpoint devices may be communicated with to receive the respective sets of utility-based data corresponding to one or more of a reading of metered power, readings of water utilities, readings of gas utilities, status conditions or diagnostic data. In some implementations, one or more sets of readings are combined with respect to sets of data as described herein. For instance, readings for power, gas and water may be combined for a particular service location (e.g., a residence or business) and collectively communicated with sets of data during respective time periods. In some embodiments, the respective sets of utility-based data include sets of utility usage data received from at least two utility meters that respectively meter power provided via the alternating current.

In some embodiments, the ECC data is partitioned into a number of portions corresponding to a number of the second sets of utility-based data. For example, where the respective sets of data are communicated during a period of one hour and correspond to utility readings occurring every 15 minutes, four sets of data are communicated per hour. In such an application, the ECC data can be partitioned into four pieces and each of the four portions can be interleaved with a respective set of the utility reading that occurs on the 15-minute interval.

As consistent with the above, the respective sets of utility-based data can be communicated over respective communication cycles. Accordingly, for each of a multitude of such subsequent communication cycles, sets of utility-based data for that communication cycle are communicated as interleaved with ECC data generated from utility-based data for a previous one of the communication cycles.

In accordance with another example embodiment, time-sensitive utility-usage data is communicated over power distribution lines as follows. A first set of utility-usage data is received, stored, and encoded according to a transmission protocol, and transmitted over one or more of the power distribution lines. A second set of utility-usage data is thereafter received, encoded, stored and transmitted over the one or more power distribution lines, also according to the transmission protocol. Validation type data such as ECC data is generated based upon both the first and second sets of utility-usage data, and is stored. For example, Reed-Solomon ECC data can be generated for several sets of utility-usage data. After transmitting the first and second sets of utility-usage data, a third set of utility-usage data is received, stored and interleaved with respective portions of the stored validation type data. The interleaved data is encoded according to the transmission protocol and transmitted over the one or more power distribution lines. In some implementations, the respective sets of data are transmitted using symbols having a symbol period that corresponds to a frequency of AC power carried on the power distribution lines (e.g., where the utility-usage data may include usage of the AC power).

As consistent with above-discussed embodiments, the respective sets of time-sensitive utility-usage data may be communicated during the course of respective time periods with the validation-type data for each set transmitted over the course of a subsequent time period. For instance, such a subsequent time period may be consecutive such that ECC data is communicated with each subsequent time period for an immediately preceding time period (or several immediately preceding time periods).

In some implementations, the respective first and second sets of time-sensitive utility-usage data are demodulated independently from one another. ECC data is generated using prior knowledge of both sets of time-sensitive utility-usage data, and is subsequently used in validating each of the first and second sets of time-sensitive utility-usage data after transmission thereof over the one or more power distribution lines.

Similar approaches can be used to subsequently validate the third set (and additional sets) of time-sensitive utility-usage data, and can be effected on an ongoing or periodic basis. For instance, the first and second sets of utility-based data can be transmitted during a first communication cycle, with the encoded interleaved data being transmitted during a second communication cycle immediately after the first communication cycle. For each of a multitude of subsequent communication cycles, sets of utility-usage data for the communication cycle can be interleaved with ECC data generated from utility-usage data for a previous one of the communication cycles.

Various other example embodiments are directed to apparatuses including a processing circuit and a communication circuit that communicates signals carried on a power distribution line carrying alternating current. The processing circuit may, for example, be a location-based circuit or a distributed type of circuit having respective portions that are communicatively coupled to one another. The processing circuit communicates via the communication circuit and over the power distribution lines carrying alternating current. This communication includes encoded first sets of utility-based data respectively corresponding to readings of utility usage taken at different times during a first time period, and encoded second sets of utility-based data respectively corresponding to readings of utility usage taken at different times during a second time period. The second sets of utility-based data are interleaved with portions of error correction code (ECC) data for the first sets of utility-based data (e.g., with the processing circuit carrying out the interleaving). Prior to receiving or prior to using the portions of ECC data, the first sets of utility-based data are interpreted (e.g., demodulated and/or decoded) and access is provided there to as raw/unverified data. Subsequent to receiving the ECC data, the processing circuit uses the ECC data to verify the first sets of utility-based data, and provides access to the verified first sets of utility-based data. In these and other contexts, providing access may, for example, involve communicating data to a user such as by generating data for displaying information corresponding to or otherwise characterizing the utility-based data. The processing circuit may be implemented in a variety of manners, to carry out one or more functions as described herein (e.g., as above or below in connection with the figures).

Accordingly, the first sets of utility-based data can be immediately provided for access as they are received, and later presented in a verified/corrected form after error correction data for the first sets are received. Using an hour-long cycle and 15-minute intervals at which utility-based data is provided by way of example, the first and second sets of utility-based data each include four portions communicated at 15-minute intervals, the first set is communicated over the course of a first hour. Once all four portions have been obtained, an error correction code (ECC) can be calculated based on the first set of data. This ECC is then split into four portions and interleaved with four portions of the second set of utility-based data as the portions are communicated over a second hour. At the end of this second hour, the ECC portions have all been received at a receiver and can be used to verify/correct the utility-based data received at each 15-minute interval during the first hour. This process can continue on with the second set of utility-based data and later sets, if applicable.

Turning now to the Figures, FIG. 1 is a block diagram of an example network environment 100 in which endpoints 102 transmit data. The network environment 100 includes a service network 101 in which a plurality of endpoints 102a-102f are coupled (e.g., communicatively coupled) to collectors 104a-104n. The endpoints 102 can be implemented as a device capable of transmitting data in the network environment 100. For example, the endpoints 102 can be connected to or part of meters in a utility network, computing devices, television set top terminals or telephones that transmit data in the service network 101. The description that follows refers to the endpoints 102 as power meters in a power distribution network. However, the description herein is applicable to other types of endpoints 102 in utility networks or other networks. For example, endpoints including gas meters, water meters, status-reporting devices and diagnostic devices can be implemented with or as the endpoints as shown. Information communicated within the network environment 100 can be further communicated via an interface-type device 106 through one or more other data networks 110 (e.g., such as a LAN, WAN or the Internet) to one or more user devices 120 and 122.

Various aspects of the network environment 100 can be implemented in accordance with one or more embodiments and implementations as discussed above, for communicating utility-based data. For example, utility-based data 103a and 103b obtained from endpoint devices 102a-102f, can be communicated to one or more collectors 104a-104n using respective communication circuits (e.g., transmitters, receivers or transceivers) with one or more processing circuits to carry out respective communication, interleaving, interpreting and presentation-based functions as discussed herein. Moreover, several embodiments are directed to one or more different sub-parts as shown in FIG. 1 (e.g., to an endpoint, to a collector, or to circuits within the respective endpoints and collectors such as communication circuits and processing circuits).

In some implementations, the endpoints 102a-102f implement a processor circuit to encode first and second sets of utility-based data based upon a communication protocol for communicating the utility-based data with alternating current on the power distribution lines, and transmit the encoded sets of utility-based data on the power distribution line, using a communication circuit (e.g., an interface to power lines 105a, 105b, 105c for sending and/or receiving data). Communication and processing circuits at the collectors receive and process data from the endpoints as discussed herein. The respective encoding and transmission may be effected, for example, based upon a communication protocol for communicating utility-based data with alternating current on the power distribution lines 105a-105c. Processor circuit implementations respectively at the endpoints and the collector transmit and receive utility data in this context, with the collector-based processing circuit interpreting and providing access to unverified utility-based data, with subsequent verification as discussed herein.

The endpoints 102 can be implemented to monitor and report various operating characteristics of the service network 101. For example, in a power distribution network, meters can monitor characteristics related to power usage in the network. Example characteristics related to power usage in the network include average or total power consumption, power surges, power drops and load changes, among other characteristics. In gas and water distribution networks, meters can measure similar characteristics that are related to gas and water usage (e.g., total flow and pressure).

The endpoints 102 report utility-based data over communications channels within power-distribution lines 105a, 105b and/or 105c, with separate lines 105a and 105b shown by way of example for optional implementation with only one collector 104a. Communications channels are portions of spectrum over which data are transmitted within the power-distribution lines. The center frequency and bandwidth of each communications channel can depend on the communications system in which they are implemented. In some implementations, the communications channels for utility meters (e.g., power, gas and/or water meters) can be implemented in power line communication networks that dynamically allocate available bandwidth according to an orthogonal frequency division multiple access (OFDMA) spectrum allocation technique or another channel allocation technique such as time division multiple access (TDMA), code division multiple access (CDMA), and other frequency division multiple access techniques.

In certain embodiments, the endpoints 102 are implemented as power meters in a power distribution network and transmit reporting data that specify meter information, such as information characterizing measures of total power consumption, power consumption over a specified period of time, peak power consumption, instantaneous voltage, peak voltage, minimum voltage and other measures of related to power consumption and power management (e.g., load information). Each of the power meters can also transmit status data that specify a status of the power meter (e.g., operating in a normal operating mode, emergency power mode, or another state such as a recovery state following a power outage).

In some implementations, symbols (i.e., representing one or more bits) including reporting and/or status data are continuously or intermittently transmitted over a specified symbol period, in accordance with approaches described herein. A symbol period is a period of time over which a particular symbol is transmitted.

For example, when a particular meter is required to provide updated meter information every 15 minutes (e.g., as a specified update rate for the meter), a meter can transmit a data set representing a first set of updated meter information at a first 15-minute interval, and then transmit another data set representing a next set of updated meter information at a subsequent 15-minute interval. The update rate for a meter can be specified by a network administrator based, for example, on types and amounts of updated meter information that are being received from the meter, preferences of a customer (e.g., a power company) to whom the data is being provided, and/or channel characteristics of the channel over which the data is being transmitted. An update rate of 15 minutes is used for purposes of example, but other update rates (e.g., 1 minute, 5 minutes, 10 minutes, 1 hour, or 1 day) can be used. Moreover, various embodiments are directed to setting such update rates at a remote location such as via collector 104a, communicating such information to an endpoint 102a, and using that information at the endpoint to control both the collection of data and the encoding/interleaving aspects as discussed herein. For instance, ECC data can be partitioned according to update rates as received/directed via the collector 104a.

Endpoints 102a-102c and 102d-102f transmit data 103a/103b over power line communications channels 105a, 105b and 105c to collectors 104a, 104b, which receive communications from endpoints and provide access accordingly. For example, collector 104a can include a receiver that receives the data from the endpoints (e.g., 103a from one or more endpoints 102a-102c), logs data from the data sets and further carries out processing as discussed herein. For instance, the collectors 104a, 104b may transmit the individual data (e.g., 103a) or validated versions thereof, or may generate a consolidated packet that includes data from multiple data sets (unvalidated or validated) received from the endpoints 102a-102f.

As consistent with various example embodiments described herein, a single collector (e.g., 104a) may receive data from thousands of endpoints and provide access to the data by transmitting the data sets to one or more end devices 120 and 122, via a network interface 106 and a data network 110. A single collector can thus receive data from thousands of different endpoints in a network and over thousands of different channels. Such data can be used, for example, to control aspects of the network 101 based at least in part on information extracted from the data sets 103a, 103b. For example, in a power line communication (PLC) network, data in the data sets 103a, 103b can be used to characterize power usage, in response to which aspects of the provision of power via power distribution line 105a may be controlled. In other implementations, the collectors 104a, 104b themselves use data in the data sets 103a, 103b to control or otherwise operate aspects of the network 101.

In some implementations, additional resources may be allocated to distribution line 105a (e.g., load balance) or provide data specifying that there is increased power usage in the particular portion of the power network, based upon data received via the data sets 103a, 103b. Moreover, using approaches herein as implemented for providing rapid access to unverified data, such power load balancing can commence immediately upon receipt of the data sets, prior to verification. Once subsequent data sets with validation data such as an ECC are received, the unverified data sets can be verified and, if appropriate, corrected. This verified/corrected data can then be used to further fine-tune the operation of the network 101 such as by load balancing further. In this context, rapid load-balancing functions can be implemented using unverified data and, upon verification, a more accurate load-balancing may be carried out.

In some implementations, the collectors 104a, 104b provide data for access by user devices 120 and 122 that can be accessed, for example, by a network operator, maintenance personnel and/or customers. For example, data identifying the increased power usage described above can be provided to a computer device 120 accessible by the network operator, who can, in turn, determine an appropriate action regarding the increased usage. Additionally, data identifying a time-of-use measure and/or a peak demand measure can also be provided to the computer device 120. Similarly, if there has been a power outage, data can be provided to a hand-held device 122 to notify a customer of the outage, and in some instances, information estimating a duration of the outage or providing other status data therefore (e.g., confirmation of re-establishment of utility services).

The data network 110 can be a wide area network (WAN), local area network (LAN), the Internet, or any other communications network. The data network 110 can be implemented as a wired or wireless network. Wired networks can include any media-constrained networks including, but not limited to, networks implemented using metallic wire conductors, fiber optic materials, or waveguides. Wireless networks include all free-space propagation networks including, but not limited to, networks implemented using radio wave and free-space optical networks. Further, the service network 101 can include many different endpoints, collectors, distribution lines and interfaces.

Data sets (e.g., 103a, 103b) from a particular endpoint (e.g., 102a) may be transmitted over one of thousands of communications channels in a PLC system. For example, each endpoint can be assigned a particular channel using OFDMA or another channel allocation technique. Channel assignments for the endpoints 102a-102c, 102d-102f that communicate with particular collectors 104a, 104b can be stored, for example, in a communications data storage circuit. For example, as discussed further in FIG. 2, the data storage circuit may be used to store received data for subsequent verification once ECC data has been received. A similar data storage circuit may also be implemented at the endpoints 102a-102f for storing data sets from which ECC data is to be generated, and/or storing ECC data (or partitions thereof) for interleaving. In addition, data may be stored to identify aspects such as an index of endpoints, a channel that each respective endpoint has been assigned, and the collector that is responsible for receiving data sets transmitted by the respective endpoints.

A collector can use stored channel assignment data, for example, to determine which endpoint transmitted data that is received over each of the communications channels, to associate received data (e.g., meter data, status data, diagnostic data) with the proper endpoint. In turn, the collector can log (i.e., store) the data sets based on the identity of the endpoint that transmitted the data sets. Various approaches can be used to identify which endpoint a particular set of data corresponds to.

Figure 2:
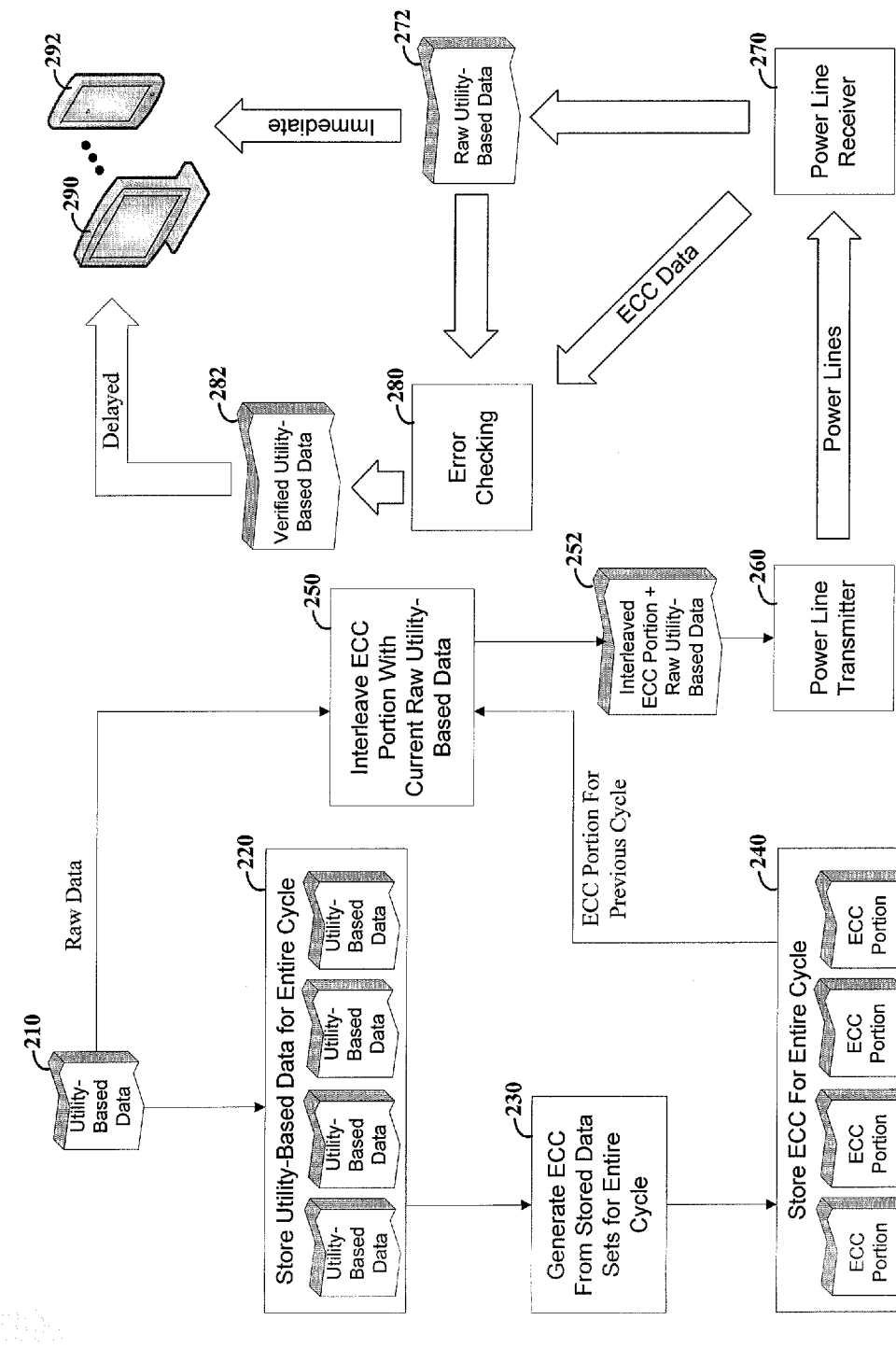
FIG. 2 is a system/data flow diagram for communicating time-based data from endpoints to a command center, consistent with example embodiments of the present disclosure.

Turning now to FIG. 2, a system/data flow diagram 200 is shown for communicating time-based data from endpoints to a command center, consistent with example embodiments of the present disclosure. Utility-based data 210 is obtained, such as by using a metering type of device to obtain information regarding power, water or gas provided to a user, or by obtaining diagnostic or status information regarding utility equipment. Each set of utility-based data 210 is stored at block 220 for an entire cycle, and subsequently used to generate an error correction code (ECC) at block 230 (e.g., parity data). For example, considering a time period of an hour and 15-minute intervals at which sets of utility-based data 210 is provided, four sets are received and stored for each hour-long cycle. The ECC code is generated at block 230 at the end of this cycle, using all of the utility-based data received during the cycle. The ECC data generated at block 230 is partitioned and stored at block 240 into smaller portions, for interleaving with raw ECC data.

Each set of utility-based data set 210 is interleaved with a portion of ECC data from a previous cycle at block 250 to generate data for communication over power lines, including raw (current) utility-based data and ECC data from a previous cycle (and from different utility-based data). For instance, using the above hour-long cycle example, an ECC from a previous hour can be split into four smaller portions of ECC data and each portion can be interleaved with raw utility-based data 210 for a subsequent hour. Encoding may be effected at block 250, respectively with the utility-based data set 210 and the ECC portion, such as by using Reed-Solomon block coding. The interleaved data 252 is communicated via power distribution lines using a power line transmitter 260 and a power line receiver 270.

At receiver 270, the interleaved data 252 is received and interpreted (e.g., demodulated) to present raw utility-based data 272 for immediate access by one or more devices 290 and 292. This raw utility-based data 272 corresponds generally to raw utility-based data 210, with possible errors introduced during processing or communication over the power lines.

Interleaved ECC data portions are also provided to an error checking block 280, together with the unverified utility-based data 272. After all ECC data portions for a particular ECC for an entire set of utility-based data have been received, the error checking block 280 combines the ECC data portions to recreate the ECC, and uses the ECC to verify/validate stored sets of raw utility-based data provided during a previous cycle from which the ECC was generated. This verified utility-based data 282 is then presented for delayed access, such as via devices 290 and 292 which may be programmed to operate upon the data to control one or more aspects of a utility-based system, or may present data for user interaction.

Accordingly, raw utility-based data is provided for access as the data is received, facilitating rapid response to information. Once an ECC has been received, the sets are verified and again provided for access, which can be used to fine-tune or adjust any response to the unverified data. Using the above example regarding one-hour periods, raw utility-based data provided during a first hour can be provided for immediate access, and after all ECC data for the first hour has been received during a second hour (as interleaved with subsequent sets of raw data), the ECC can be regenerated and used to correct the first-hour data during a third hour.

Each of the blocks and functions as shown in FIG. 2 may be implemented using one or more approaches and apparatuses as described herein. For example, the blocks 230 and 250 may be implemented at endpoint devices such as shown in FIG. 1. Blocks 270 and 280 may be implemented at collectors as shown in FIG. 1. Moreover, a processor circuit may include distributed processors that are implemented at different locations to carry out different functions.

To provide for interaction with a user, various embodiments are directed to implementation on a computer having a display device such as a LCD (liquid crystal display) monitor or touch-screen for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Various embodiments described herein can be implemented in a computing system that includes a back-end component, e.g., as a data server, or that includes a middleware component, e.g., an application server, or that includes a front-end component, e.g., a client computer having a graphical user interface. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

Systems as described herein can include clients and servers. A client and server are generally remote from each other and may interact through a communication network such as described herein. The relationship of client and server arises by virtue of computer programs running on the respective computers and having a client-server relationship to each other. In some embodiments, a server transmits data to a client device (e.g., for purposes of controlling the client device, or displaying data to and receiving user input from a user interacting with the client device). Data generated at the client device (e.g., a result of the user interaction) can be received from the client device at the server.

The signals and associated logic and functionality described in connection with the figures can be implemented in a number of different manners. Unless otherwise indicated, various general purpose systems and/or logic circuitry may be used with programs in accordance with the teachings herein, or it may prove convenient to construct a more specialized apparatus to perform the required method. For example, according to the present disclosure, one or more of the methods can be implemented in hard-wired circuitry by programming a general-purpose processor, other fully or semi-programmable logic circuitry, and/or by a combination of such hardware and a general-purpose processor configured with software. Accordingly, the various components and processes shown in the figures can be implemented in a variety of circuit-based forms, such as through the use of data processing circuit modules.

It is recognized that aspects of the disclosure can be practiced with computer/processor-based system configurations other than those expressly described herein. The required structure for a variety of these systems and circuits would be apparent from the intended application and the above description.

The various terms and techniques are used by those knowledgeable in the art to describe aspects relating to one or more of communications, protocols, applications, implementations and mechanisms. One such technique is the description of an implementation of a technique expressed in terms of an algorithm or mathematical expression. While such techniques may be implemented, for example, by executing code on a computer, the expression of that technique may be conveyed and communicated as a formula, algorithm, or mathematical expression.

For example, block denoting "C=A+B" as an additive function whose implementation in hardware and/or software would take two inputs (A and B) and produce a summation output (C), such as in combinatorial logic circuitry. Thus, the use of formula, algorithm, or mathematical expression as descriptions is to be understood as having a physical embodiment in at least hardware (such as a processor in which the techniques of the present disclosure may be practiced as well as implemented as an embodiment).

In certain embodiments, machine-executable instructions are stored for execution in a manner consistent with one or more of the methods of the present disclosure. The instructions can be used to cause a general-purpose or special-purpose processor that is programmed with the instructions to perform the steps of the methods. The steps may be performed by specific hardware components that contain hardwired logic for performing the steps, or by any combination of programmed computer components and custom hardware components.

In some embodiments, aspects of the present disclosure may be provided as a computer program product, which may include a machine or computer-readable medium having stored thereon instructions which may be used to program a computer (or other electronic devices) to perform a process according to the present disclosure. Accordingly, the computer-readable medium includes any type of media/machine-readable medium suitable for storing electronic instructions.

The various embodiments described above are provided by way of illustration and should not be construed to necessarily limit the invention. Based on the above discussion and illustrations, those skilled in the art will readily recognize that various modifications and changes may be made to the present invention without strictly following the exemplary embodiments and applications illustrated and described herein. For instance, such changes may include variations on mechanisms for synchronization with (and/or tracking of) the AC line frequency. Such modifications and changes do not depart from the true spirit and scope of the present invention, including aspects set forth in the following claims.

What is claimed is:

1. A method for communicating sets of utility-based data over power distribution lines carrying alternating current, each set of utility-based data being indicative of a reading of utility usage, the method comprising:
   communicating, over the power distribution lines carrying alternating current, encoded first sets of the utility-based data respectively corresponding to readings of the utility usage taken at different times during a first time period;
   communicating, over the power distribution lines carrying alternating current, encoded second sets of the utility-based data respectively corresponding to readings of the utility usage taken at different times during a second time period, the second sets of the utility-based data being interleaved with portions of error correction code (ECC) data for the first sets of the utility-based data;
   prior to receiving the portions of ECC data, interpreting and providing access to the first sets of utility-based data; and
   subsequent to receiving the ECC data, using the ECC data to verify the first sets of utility-based data, and providing access to the verified first sets of utility-based data.

2. The method of claim 1,
   further including generating the ECC data based upon the first sets of the utility-based data, and interleaving portions of the ECC data with ones of the second sets of the utility-based data, and
   wherein using the received ECC data to verify the first sets of utility-based data includes combining the portions of ECC data received with ones of the second sets of utility-based data, and using the combined ECC portions to verify the entire first sets of utility-based data.

3. The method of claim 1, wherein the encoded first sets of the utility-based data are encoded using a Reed-Solomon block coding and wherein the ECC data is parity data for the entire encoded first sets of the utility-based data.

4. The method of claim 1, wherein interpreting and providing access to the first sets of utility-based data includes demodulating and providing access to the first sets of utility-based data before validating the sets of utility-based data.

5. The method of claim 1, further including communicating with a plurality of endpoint devices to receive the respective sets of utility-based data corresponding to a reading of metered power.

6. The method of claim 1, wherein each one of the second sets of utility-based data is interleaved with an encoded portion of the ECC data, the portions of the ECC data interleaved with the second sets of utility-based data including all of the ECC data.

7. The method of claim 1, wherein the respective sets of utility-based data include sets of utility usage data received from at least two utility meters that respectively meter power provided via the alternating current.

8. The method of claim 1, further including partitioning the ECC data into a number of portions corresponding to a number of the second sets of utility-based data, and interleaving respective different portions of the ECC data with respective ones of the second sets of utility-based data.

9. The method of claim 1, wherein communicating encoded first sets of the utility-based data and communicating encoded second sets of the utility-based data with interleaved portions of ECC data includes modulating the respective sets of data and interleaved ECC data.

10. The method of claim 1, wherein communicating the first and second sets of utility-based data include communicating the sets of data during respective communication cycles, further including, for each of a multitude of subsequent communication cycles, communicating sets of utility-based data for that communication cycle interleaved with ECC data generated from utility-based data for a previous one of the communication cycles.

11. The method of claim 1, wherein using the ECC data to verify the first sets of utility-based data, and providing access to the verified first sets of utility-based data, includes using the ECC data to correct a transmission-based error in one of the first sets of utility-based data and providing access to the corrected one of the first sets of utility-based data.

12. A method for communicating utility-usage data over alternating-current (AC) power distribution lines, the method comprising:
   receiving and storing a first set of utility-usage data;
   encoding the first set of utility-usage data according to a transmission protocol;
   transmitting, over at least one of the AC power distribution lines, the encoded first set of utility-usage data;
   after transmitting the first set of utility-usage data, receiving and storing a second set of utility-usage data that is different than the first set of utility-usage data;
   encoding the second set of utility-usage data according to the transmission protocol;
   transmitting, over at least one of the AC power distribution lines, the encoded second set of utility-usage data;
   generating error correction code (ECC) data based upon both the first and second sets of utility-usage data, and storing the ECC data;
   receiving, after transmitting the second set of utility-usage data, a third set of utility-usage data that is different than the first and second sets of utility-usage data;
   interleaving respective portions of the stored ECC data with portions of the third set of utility-usage data to generate interleaved data;
   encoding the interleaved data according to the transmission protocol; and
   transmitting, over at least one of the AC power distribution lines, the encoded interleaved data.

13. The method of claim 12 wherein
   the first and second sets of utility-usage data are communicated during a first time period for which the ECC data is provided, the first and second sets of utility-usage data being transmitted over the AC power distribution lines in raw form for access during the first time period, and
   the third set of utility-usage data is provided with the interleaved ECC data during a second time period after the first time period, the interleaved ECC data provided during the second time period being combined and used to correct the first and second sets of utility usage data, and the corrected first and second sets of utility-usage data are provided for access during a third time period after the second time period.

14. The method of claim 12, wherein generating error correction code data includes generating Reed-Solomon error correction code data.

15. The method of claim 12, wherein the utility-usage data includes one or more of electrical usage, peak energy use, gas usage water usage, status data and diagnostic data.

16. The method of claim 12, wherein the first and second set of utility-usage data are received and transmitted during the course of a first time period and wherein the error correction code is transmitted over the course of a subsequent time period.

17. The method of claim 12, wherein the transmission protocol is configured to allow demodulation of the first set of utility-usage data independent from demodulation of the second set of utility-usage data and wherein generating the error correction requires prior knowledge of both the first set of utility-usage data and the second set of utility-usage data.

18. The method of claim 12,
wherein transmitting the first and second sets of utility-based data include transmitting the sets of data during a first communication cycle,
wherein transmitting the encoded interleaved data includes transmitting the data during a second communication cycle immediately after the first communication cycle, and
further including, for each of a multitude of subsequent communications cycles, interleaving sets of utility-usage data for the communication cycle with ECC data generated from utility-usage data for a previous one of the communication cycles.

19. An apparatus comprising:
a communication circuit configured and arranged to communicate signals carried on a power distribution line carrying alternating current; and
a processing circuit configured and arranged to
communicate, via the communication circuit and over the power distribution lines carrying alternating current, encoded first sets of utility-based data respectively corresponding to readings of utility usage taken at different times during a first time period,
communicate, via the communication circuit and over the power distribution lines carrying alternating current, encoded second sets of utility-based data respectively corresponding to readings of utility usage taken at different times during a second time period, the second sets of utility-based data being interleaved with portions of error correction code (ECC) data for the first sets of utility-based data,
prior to receiving the portions of ECC data, interpret and provide access to the first sets of utility-based data, and
subsequent to receiving the ECC data, use the ECC data to verify the first sets of utility-based data, and provide access to the verified first sets of utility-based data.

20. The apparatus of claim 19, wherein the processing circuit is configured and arranged to encode the first and second sets of utility-based data based upon a communication protocol for communicating the utility-based data with alternating current on the power distribution line, and to transmit the encoded sets of utility-based data on the power distribution line, via the communication circuit.

21. The apparatus of claim 19, wherein the processing circuit is configured and arranged to communicate the first and second sets of utility-based data by receiving the data via the power distribution line.

22. The apparatus of claim 19, wherein
the processing circuit includes first and second processing circuits that communicate over the power distribution line,
the first processing circuit is configured and arranged to encode the first and second sets of utility-based data based upon a communication protocol for communicating the utility-based data with alternating current on the power distribution line, and to transmit the encoded sets of utility-based data on the power distribution line, via the communication circuit, and
the second processing circuit is configured and arranged to
receive the utility-based data via the power distribution line, interpret and provide access to the first sets of utility-based data, and
subsequent to receiving the ECC data, use the ECC data to verify the first sets of utility-based data, and provide access to the verified first sets of utility-based data.

23. The apparatus of claim 19, wherein the communication circuit is a transceiver configured and arranged to send and receive signals via the power distribution line.

24. The apparatus of claim 19, wherein the processing circuit is configured and arranged to
generate the ECC data based upon the first sets of the utility-based data, and
interleave portions of the ECC data with ones of the second sets of the utility-based data.

25. The apparatus of claim 24, wherein the processing circuit is configured and arranged to use the received ECC data to verify the first sets of utility-based data by combining the portions of ECC data received with ones of the second sets of utility-based data, and using the combined ECC portions to verify the entire first sets of utility-based data.

26. The apparatus of claim 19, wherein the processing circuit is configured and arranged to encode the utility-based data using a Reed-Solomon block coding, and to generate the ECC data by generating parity data for the entire encoded first sets of the utility-based data.

27. The apparatus of claim 19, wherein the processing circuit is configured and arranged to interpret and provide access to the first sets of utility-based data by demodulating and providing access to the first sets of utility-based data before validating the sets of utility-based data.

28. The apparatus of claim 19, wherein the processing circuit is configured and arranged to partition the ECC data into a number of portions corresponding to a number of the second sets of utility-based data, and interleave respective different portions of the ECC data with respective ones of the second sets of utility-based data.

29. The apparatus of claim 19, wherein the processing circuit is configured and arranged to
communicate the first and second sets of utility-based data by communicating the sets of data during respective communication cycles, and
for each of a multitude of subsequent communication cycles, communicate sets of utility-based data for that communication cycle interleaved with ECC data generated from utility-based data for a previous one of the communication cycles.

30. The apparatus of claim 19, wherein the processing circuit is configured and arranged to use the ECC data to verify the first sets of utility-based data and provide access to the verified first sets of utility-based data by using the ECC data to correct a transmission-based error in one of the first sets of utility-based data and providing access to the corrected one of the first sets of utility-based data.

* * * * *